US006574262B1

(12) United States Patent
Dautremont-Smith et al.

(10) Patent No.: US 6,574,262 B1
(45) Date of Patent: Jun. 3, 2003

(54) HIGH-POWER AND HIGH EFFICIENCY LARGE AREA SINGLE-MODE LASER

(75) Inventors: William Crossley Dautremont-Smith, Orefield, PA (US); Sun-Yuan Huang, Blandon, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 09/545,473

(22) Filed: Apr. 7, 2000

(51) Int. Cl.[7] .............................. H01S 3/08; H01S 3/13
(52) U.S. Cl. ......................... 372/102; 372/32; 372/101
(58) Field of Search .............................. 372/32, 92, 29, 372/96, 6, 102, 101; 385/33

(56) References Cited

U.S. PATENT DOCUMENTS

| | | | | |
|---|---|---|---|---|
| 5,870,417 A | * | 2/1999 | Verdiell et al. ................ | 372/32 |
| 6,058,128 A | * | 5/2000 | Ventrudo ...................... | 372/96 |
| 6,125,222 A | * | 9/2000 | Anthon ......................... | 372/29 |
| 6,188,705 B1 | * | 2/2001 | Krainak et al. ............... | 372/32 |
| 6,226,311 B1 | * | 5/2001 | Meliga et al. ................ | 372/102 |

* cited by examiner

*Primary Examiner*—Quyen Leung

(57) ABSTRACT

The present invention is directed to a large area single-mode (LASM) laser system that provides a laser having a wider gain region and thus a higher power output without introducing the second transverse mode into the optical signal. The laser system of the present invention also reduces the laser junction temperature, thereby improving the reliability of the laser and of laser systems constructed therefrom. The present invention also provides a stabilized spectrum in an optical signal by providing a means for feeding back from an external fiber grating to the laser only a single mode and a selective spectrum of an optical signal generated by the laser.

31 Claims, 6 Drawing Sheets

FIG. 4

| WAVEGUIDE WIDTH (μm) | 2.5 | 5.0 | 10.0 | 20.0 |
|---|---|---|---|---|
| LASER DRIVE CURRENT (mA) | 900 | 1200 | 1600 | 2000 |
| LASER FRONT FACET POWER (mW) | 250 | 397 | 561 | 702 |

FIG. 5

| PARAMETER | Δn/n | CORE RADIUS (μm) | CUT-OFF WAVELENGTH (nm) | MODE FIELD RADIUS (μm) |
|---|---|---|---|---|
| CONVENTIONAL | 0.0036 | 4.15 | 1330 | 4.9 |
| PRESENT INVENTION | 0.0009 | 8.30 | 1330 | 9.9 |

HIGH-POWER AND HIGH EFFICIENCY LARGE AREA SINGLE-MODE LASER

FIELD OF THE INVENTION

The present invention relates to semiconductor lasers and, more particularly, to a high-power, single-mode pump laser having a widened gain medium, increased optical power, reduced laser junction temperature, and a stabilized operating spectrum.

BACKGROUND OF THE INVENTION

Semiconductor pump lasers have become indispensable components in modem fiber-optic communication systems and networks. In response to the ever-increasing demands placed on those systems and networks by the Internet, for example, Dense Wavelength Division Multiplexing (DWDM) has emerged as the communication protocol of choice; with a channel capacity in excess of eighty (80) channels. However, more channels require greater laser pumping power. For example, an eighty-channel DWDM system may require two 980 nm lasers and four 1480 nm lasers, each producing 150 mW of output power. For a Raman amplifier, more than four conventional lasers may be required. This not only increases the size of the system, but also makes the control circuits very complex. It is thus desirable to increase the pump power of a laser sufficient to eliminate the need for multiple lasers, i.e., to design a single laser with sufficient pump power and without increasing the laser junction temperature.

Laser power may be increased by increasing the chip length, thereby increasing the gain volume. That solution, however, is limited by the internal loss of the waveguide. Another solution is to increase the width of the active gain region. Unfortunately, that introduces a second transverse mode into the laser signal. Yet another solution requires the use of a master oscillator power amplifier structure. The complexity of the fabrication process and the difficulty in coupling light into a single mode fiber render that solution undesirable.

There thus exists a need in the art for a high-power laser that overcomes the above-described shortcomings of the prior art.

SUMMARY OF THE INVENTION

The present invention is directed to a large area single-mode (LASM) laser system that provides a laser having a wider gain medium and thus a higher power output without introducing the second transverse mode into the optical signal. The laser system of the present invention also reduces the laser junction temperature, thereby improving the reliability of the laser and of laser systems constructed therefrom. The present invention also provides a stabilized spectrum in an optical signal by providing a means for feeding back to the laser only a single mode of an optical signal generated by the laser.

The present invention is directed to a large area single-mode (LASM) laser system comprising a laser having a gain region of predetermined area defined by a generally horizontal gain width and generally vertical waveguide width and including a gain medium. The laser is preferably operable in spontaneous emission mode and causes an optical signal to propagate from the laser in a propagation direction. The LASM laser system also includes an optical signal conditioner located downstream from the laser in the propagation direction. The optical signal conditioner reflects a single mode of the optical signal in a direction opposite of the propagation direction and facilitates single-mode operation of the laser.

In another embodiment of the present invention, a large area single mode (LASM) laser system comprises a laser having a gain region of predetermined area defined by a generally horizontal gain width and generally vertical waveguide width and including a gain medium. The laser is preferably operable in spontaneous emission mode and causes an optical signal to propagate from the laser in a propagation direction. The LASM laser system of this embodiment also includes a first lens located downstream from the laser in the propagation direction for focusing the optical signal in a generally vertical direction with regard to the gain region and in a direction opposite of the propagation direction. The LASM laser system further includes a second lens located downstream from the first lens in the propagation direction and for collimating the optical signal in a generally horizontal direction and in a generally vertical direction, with regard to the gain medium. The LASM laser system additionally includes a single-mode fiber-optic cable located downstream from the second lens in the propagation direction and having a fiber grating for reflecting a single-mode of the optical signal in a direction opposite of the propagation direction. The reflected single-mode of the optical signal facilitates single-mode operation of the laser.

In yet another embodiment of the present invention, a large area single-mode (LASM) laser system comprises a laser having a gain region of predetermined area defined by a generally horizontal gain width and generally vertical waveguide width and including a gain medium. The laser is preferably operable in spontaneous emission mode and causes an optical signal to propagate from the laser in a propagation direction. The LASM laser system of this embodiment also includes a tapered fiber-optic system located downstream from the laser in the propagation direction and that has a cylindrical lens at an optical input of the tapered fiber-optic system, and a tapered fiber core optically coupled to a single-mode fiber-optic cable including a fiber grating for reflecting a single-mode of said optical signal in a direction opposite of the propagation direction. The reflected single-mode of the optical signal facilitates single-mode operation of the laser.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference characters denote similar elements throughout the several views:

FIG. 4 is a table comparing the available front facet power of a conventional single-mode laser and a large area single-mode LASM laser system constructed in accordance with the present invention;

FIG. 5 is a table comparing various parameters for a fiber-optic cable before and after that cable is tapered in accordance with the present invention;

DETAILED DESCRIPTION OF THE PRESENTLY PREFERRED EMBODIMENTS

The present invention is directed to a large area single-mode (LASM) laser system that provides a laser having a wider gain region and gain medium and thus a higher power output than conventional, prior art lasers and without introducing the second transverse mode into the optical signal. The laser system of the present invention also reduces the laser junction temperature, when compared with conventional lasers, thereby improving the reliability of the laser and of laser systems constructed therefrom. The present invention also provides a stabilized spectrum in an optical signal by providing a means for feeding back to the laser only a single mode of an optical signal generated by the laser.

Figure 1A:
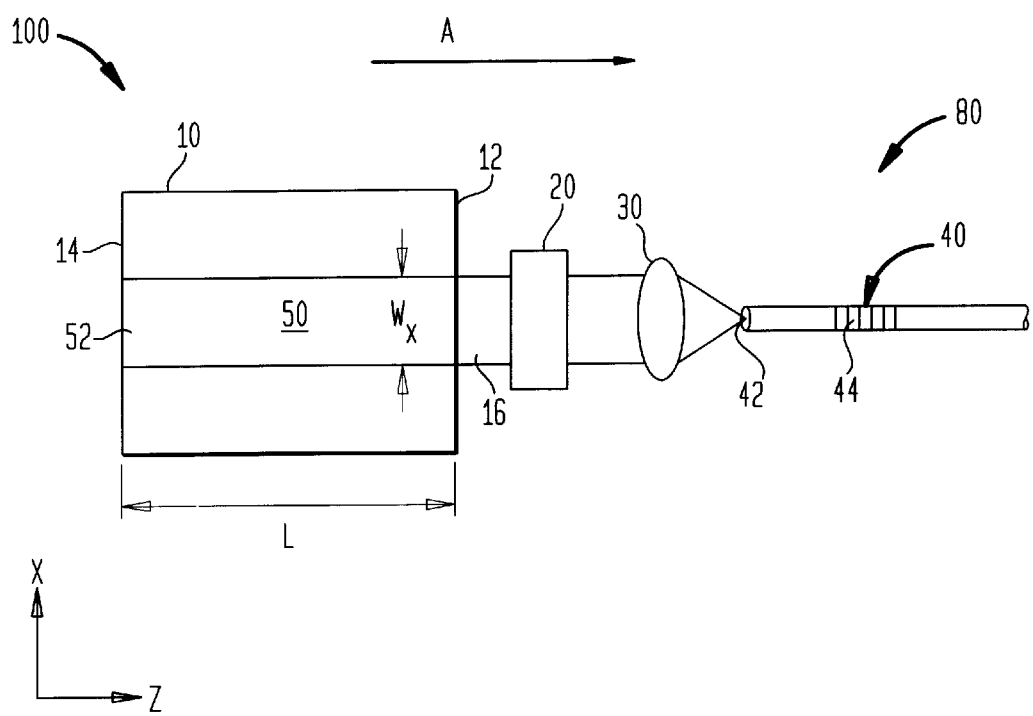
FIG. 1A depicts a top, partial cross-sectional view of a large area single-mode (LASM) laser system in accordance with an embodiment of the present invention.
Figure 1B:
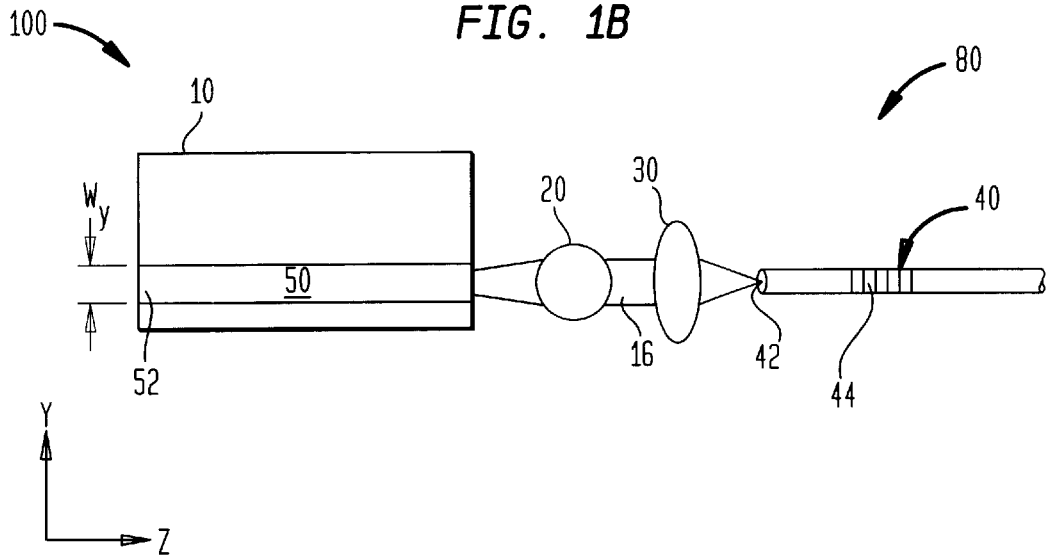
FIG. 1B depicts a side, partial cross-sectional view of the laser system of FIG. 1A.

Referring now to the drawings in detail, and with initial reference to FIGS. 1A and 1B, an embodiment of a large area single-mode (LASM) laser system 100 in accordance with the present invention is there depicted. The LASM laser system 100 includes a LASM semiconductor laser 10 such as, for example, InP for a 1480 nm pump laser and GaAs for a 980 nm pump laser. The laser 10 includes a gain region 50 constructed of a gain medium 52 that may be any suitable, art-recognized, semiconductor gain medium. The gain region 50 is defined by a horizontal (i.e., along the x-axis) gain width $W_x$ and a vertical (i.e., along the y-axis) waveguide width $W_y$. Preferably, the gain width $W_x$ is between approximately 2.5 µm and 20 µm; with single-mode operation occurring at a gain width $W_x$ approximately equal to 2.5 µm, and multi-mode operation occurring at a gain width $W_x$ in the range approximately equal to 5 µm to 20 µm. The waveguide width, $W_y$, is preferably approximately equal to 0.8 µm, thus providing a gain region having an area in the range approximately equal to 2 µm² to 16 µm².

The laser 10 includes a front facet 12 having an anti-reflective coating disposed thereon and having a reflectivity approximately equal to zero. The laser 10 also includes a rear facet 14 having a high reflective coating disposed thereon and having a reflectivity approximately equal to one.

The LASM laser system 100 of FIGS. 1A and 1B also includes an optical signal conditioner 80 including a cylindrical lens 20, a focusing lens 30 and a single-mode fiber-optic cable 40; all optically coupled together along a propagation direction, indicated by arrow A for an optical signal 16. The cylindrical lens 20 is located downstream from the laser 10 in the propagation direction of the optical signal 16. Initially (i.e., before lasing occurs), the optical signal 16 may be a single-mode or a multi-mode signal. However, when the laser 10 has achieved a steady-state condition (i.e., lasing), the optical signal is a single-mode signal, as described in detail below. The lens 20 collimates the optical signal 16 in the vertical (see, e.g., FIG. 1B) directions along the propagation direction, and causes the optical signal 16 to be focused also in the vertical direction onto the front facet 12 when propagating in a direction opposite of the propagation direction. As can be seen from FIGS. 1A and 1B, focusing of the optical signal 16 by the lens 20 in the direction opposite of the propagation direction is only in the vertical direction and the width of the optical signal 16 in that direction is approximately equal to the vertical waveguide width, $W_y$. Focusing of the optical signal 16 by the lens 20 in the direction opposite of the propagation direction does not occur in the horizontal direction, and the width of the optical signal 16 in that direction is approximately equal to the horizontal gain width $W_x$.

The optical signal conditioner 80 also, includes a focusing lens 30 that is located downstream from the cylindrical lens 20 in the propagation direction, and a fiber cable 40 located downstream from the focusing lens 30. The focusing lens 30 causes the collimated optical signal 16 to focus in both the vertical and horizontal directions onto an input 42 of a single-mode fiber-optic cable 40. A fiber grating 44 (a periodic perturbation of the refractive index along the fiber-optic cable) provided in the fiber-optic cable 40 preferably causes a single-mode of the optical signal 16 to constructively interfere with other optical signals within the gain region 50 and reflected back toward the laser 10 which, in turn, facilitates single-mode lasing in the laser 10. The fiber grating 44 stabilizes the wavelength of a single-mode laser over larger driving currents and ambient temperatures.

In operation, the laser 10 is initially operated in spontaneous emission mode, and only part of the power of the optical signal 16 is coupled into the single-mode fiber cable 40. The fiber grating 44 provides a wavelength-selective reflection having a center wavelength near the gain peak of the spontaneous emission of the laser 10. The fiber grating 44 also facilitates single-mode operation of the laser 10 by causing a single-mode of the optical signal 16 to be reflected back to the laser 10. Lasing thus occurs in the gain region 50 of the laser 10, at least in reflected optical signal to dominate any parasitic reflection contained within that signal. This forces the lasing action to happen at the single transverse mode of the laser 10. The reflected optical signal is first collimated by the focusing lens 30 to a width that is preferably approximately equal to the width of the horizontal gain width, $W_x$. The cylindrical lens 20 only focuses the collimated optical signal from the focusing lens 30 along the vertical direction. The focused waist of the reflected optical signal is preferably approximately equal to the vertical waveguide width, $W_y$.

The fiber grating 44 changes the effective refractive index of a part of the fiber cable 40, e.g., that part upon which the grating 44 is provided. This causes a single mode of the optical signal impinging on the input 42 of the fiber cable 40 to be reflected back toward the laser 10. To form the fiber grating 44 on the fiber cable 40, ultra-violet (UV) light is directed through a mask (not shown) having a predetermined periodicity and onto the fiber cable 40. Where the UV light contacts the fiber cable 40 with high intensity, the effective refractive index of the fiber cable 40 increases. Where the UV light contacts the fiber cable 40 with low intensity, the change of the effective refractive index of the fiber cable 40 decreases. It is thus possible to produce a fiber cable 40 having both high and low refractive indices; this being provided in accordance with the present invention by the fiber grating 44. The wavelength selectivity of the fiber grating 44 may be controlled and determined by the periodicity of the mask and by the relative placement of the high and low refractive index parts of the fiber-optic cable 40. After exposure to the UV light, the fiber cable 40 is thereafter annealed to increase its operational lifetime.

Alternatively, commercially available grating may be provided at or near the input 42 of the fiber cable 40, to achieve the desired wavelength selectivity, single-mode reflection and operation, and other desired results provided for by the present invention.

Figure 3:
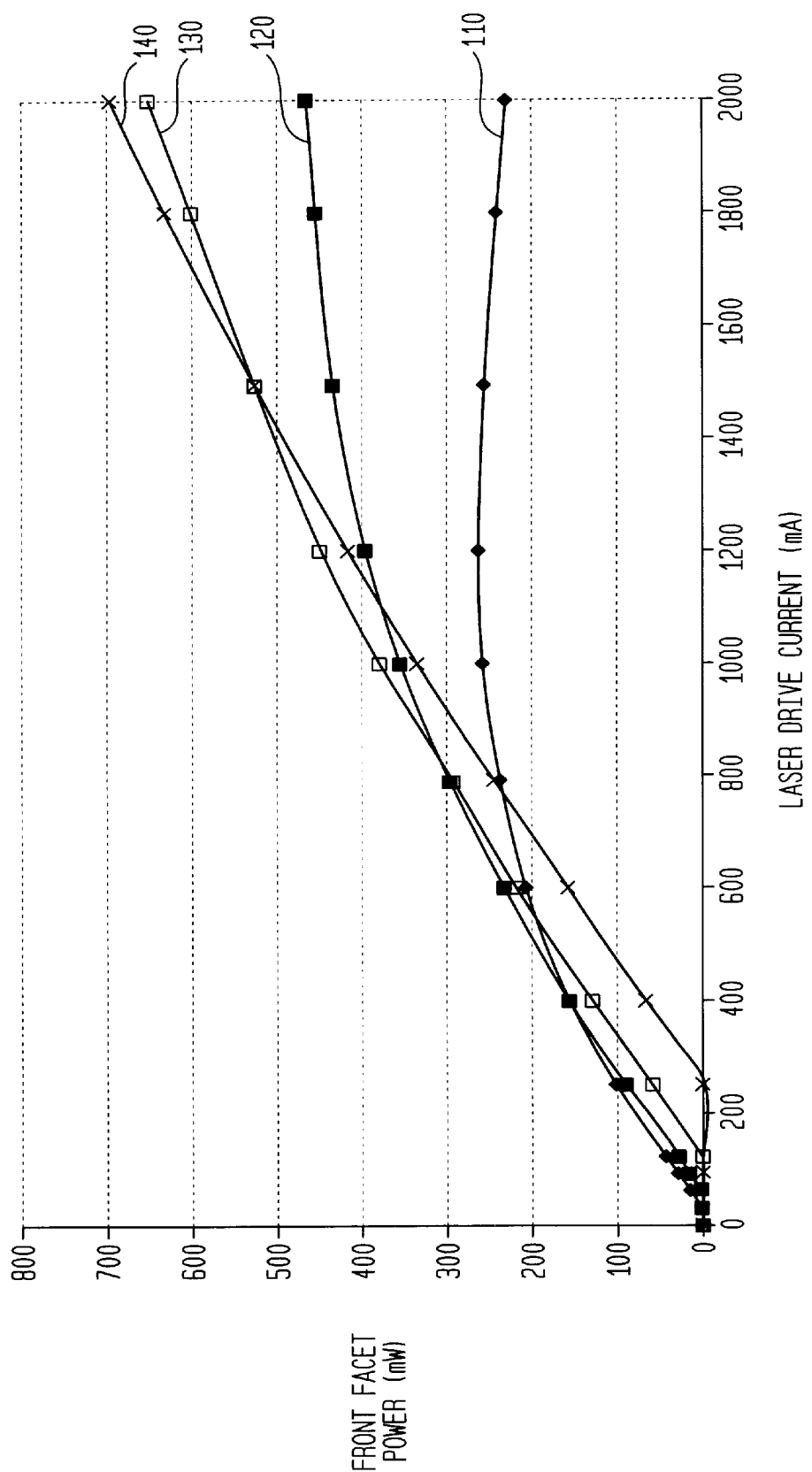
FIG. 3 graphically depicts the light-current (LI) curves for a conventional single-mode laser compared with various embodiments of a large area single-mode laser (LASM) constructed in accordance with the present invention.

With reference next to FIG. 3, which graphically depicts the light-current (LI) curves for a conventional single-mode laser compared with various embodiments of a LASM laser 10 constructed in accordance with the present invention. The rate equations (which describe the change of photons and carriers in a laser) for single mode laser were used to simulate the performance of the LASM laser 10. The conventional single-mode laser considered for graphical analysis depicted in FIG. 3 was a high-performance 1480 nm pump laser having the following characteristics: a waveguide width, $W_x$, of 2.5 $\mu$m; a series resistance of 2 Ohms; an internal loss of 16 cm$^{-1}$; a spreading thermal impedance of 20° C./W; a carrier thermal impedance of 5° C./W; a temperature dependent loss of 1 cm$^{1-1}$/° C.; a threshold current of 33 mA; a front facet power at 600 mA of 207 mW; and a roll-over current of 1100 mA for a chip length L of 1 mm. The LI curve for that laser achieve a peak power of approximately 200 mW at a drive current of approximately 1200 mA, and is indicated as 110 in FIG. 3. The embodiments of the present invention depicted in FIG. 3 are generally indicated as 120, 130, and 140 for waveguide widths, $W_x$, of 5, 10, and 20 $\mu$m, respectively. Except for the series resistance and the spreading thermal impedance, the other parameters (as indicated above for the conventional laser) for the LASM laser 10 of the present invention were the same or approximately the same values as the conventional laser for purposes of FIG. 3. Electrically, the series resistance of a LASM laser 10 is inversely proportional to the waveguide width, $W_x$. Thermally, the spreading thermal impedance is also inversely proportional to the waveguide width, $W_x$. Thus, as the waveguide width increases, the junction temperature decreases. This is because less joule heat is generated with the same current and less temperature difference is needed to dissipate the same heat.

A reduction in the junction temperature is an important consideration for the design of integrated circuit packaging for lasers and laser systems, such as those discussed herein. For example, for a 14-pin butterfly-type package, such as the type typically used in telecommunications applications, the available pump power for a conventional single-mode laser (such as described above) with a thermal heat value of 2.1 W, may be nearly tripled with a LASM laser 10 constructed in accordance with the present invention. Specific front facet power values for various waveguide widths for a conventional single-mode laser and for three embodiments of the present invention (all discussed above with reference to FIG. 3) are provided in FIG. 4. Thus, from FIG. 4, it can be seen that the available pump power from a single-mode laser may be significantly increased by increasing the waveguide width (i.e., by increasing the area of the gain region 50 or the amount of gain medium 52 provided) without introducing a second transverse mode in the optical output signal. A LASM laser 10 constructed in accordance with the present invention may thus make it possible to replace a plurality of conventional single-mode lasers with a single LASM laser 10 to provide an improved LASM laser system 100 having a higher output power without an increase in the laser function temperature and without introducing a second transverse mode in the optical signal.

Figure 2A:
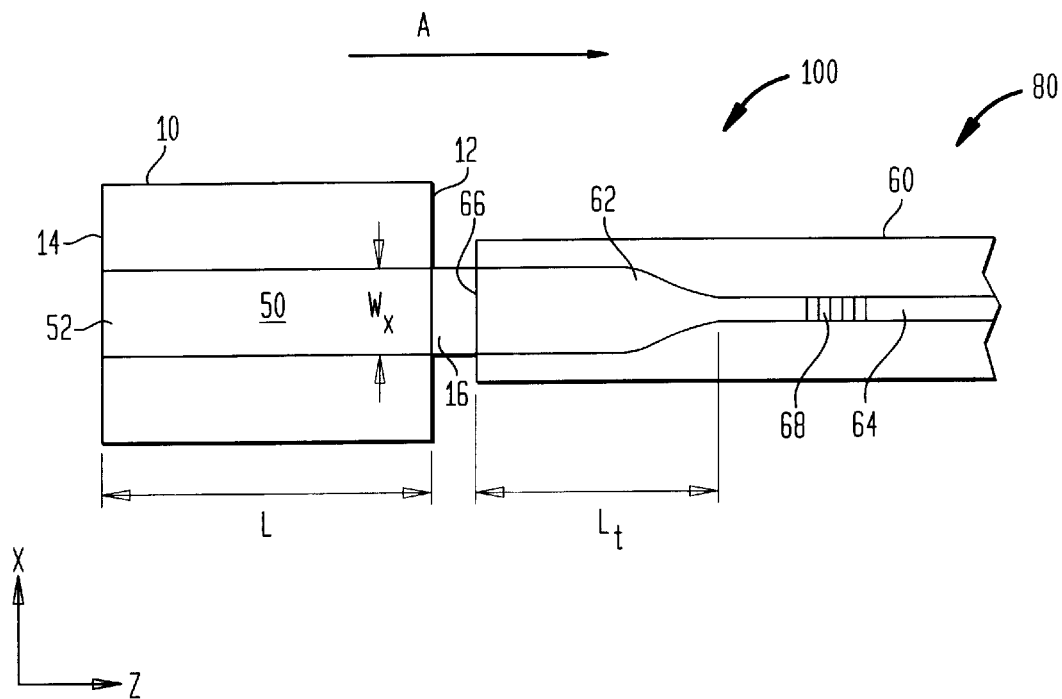
FIG. 2A depicts a top, partial cross-sectional view of a large area single-mode (LASM) laser system in accordance with an embodiment of the present invention.
Figure 2B:
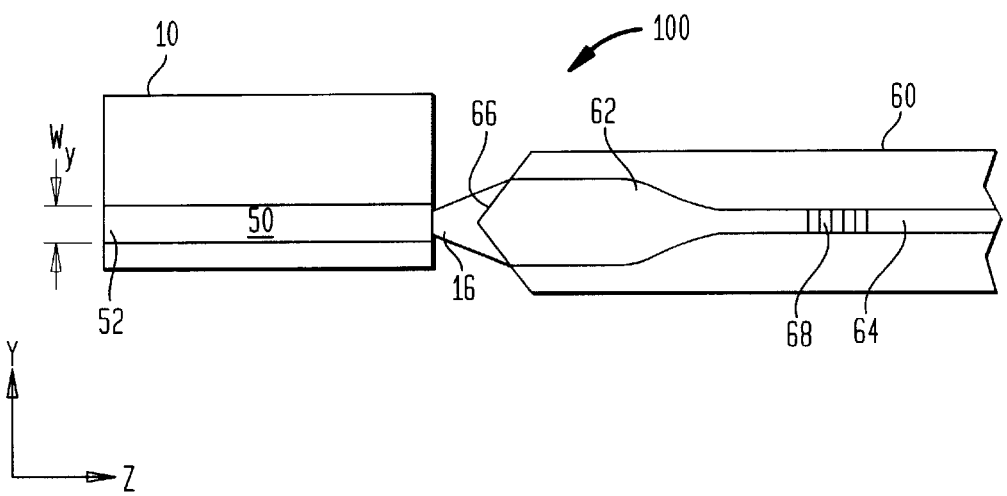
FIG. 2B depicts a side, partial cross-sectional view of the laser system of FIG. 2A.

With reference next to FIGS. 2A and 2B, another embodiment of a LASM laser system 100 in accordance with the present invention is depicted. The laser 10 of the embodiment of FIGS. 2A and 2B is substantially the same as described above for FIGS. 1A and 1B. The optical signal conditioner 80 of the embodiment of FIGS. 2A and 2B includes a tapered fiber-optic system 60 having a cylindrical lens 66 located at an input to the system 60 and that is optically coupled to a tapered fiber core 62 and to a single-mode fiber-optical cable 64 having a fiber grating 68 defined therein. The fiber core 62 is preferably tapered out to a width that substantially matches the horizontal mode field diameter of the gain region 50, as depicted in FIG. 2A. The cylindrical lens 66 collects the generally divergent optical signal 16 emitted by the front facet 12 of the laser 10. The lens 66 also acts as a vertically focusing lens for the optical signal reflected by the fiber grating 68 and coupled back to the laser 10 in a direction opposite of the propagation direction A due to the reciprocal property of the optical wave. The tapered core 62 and the cylindrical lens 66 also transform the shape of the optical signal from the elliptical shape emitted by the laser 10 in the gain region 50 to a generally circular shape which is a preferable input to the fiber cable 64.

A LASM laser system 100 constructed in accordance with the embodiment depicted in FIGS. 2A and 2B provides increased coupling efficiency when compared with a conventional single-mode fiber-optic cable. A conventional single-mode fiber-optical cable typically has a core radius of approximately 4.15 $\mu$m, a refractive index difference, $\Delta$n, between core and cladding of 0.0036, and a horizontal mode field radius of 4.9 $\mu$m at a wavelength of 1480 nm. It is desirable to efficiently couple the generally divergent optical signal from a large area single-mode laser into a fiber-optic cable. For example, a large area single-mode laser having a waveguide width, $W_x$, of 20 $\mu$m, a horizontal mode field radius of 10 $\mu$m, and a vertical mode field of 1 $\mu$m, yields a ratio between the horizontal mode field radius of the laser and that of the conventional fiber-optic cable approximately equal to 2.0; thus requiring that the core of the fiber be tapered to a width approximately equal to twice its original width. To taper the fiber one can use a generally art-recognized thermally diffused taper core process whereby the fiber is subjected to a high temperature heating by either micro-burner or micro-heater. The length of the taper region, $L_T$, may be from approximately 2 cm to 20 cm; this length being limited by available lens polishing processes on the short side (i.e., 2 cm) and by the heating process on the long side (i.e., 20 cm). The table provided in FIG. 5 compares various parameters of a conventional single-mode fiber-optic cable with a tapered fiber-optic system 60 constructed in accordance with the present invention. A significant reduction in the refractive index is provided in the tapered fiber core 62, with the core radius and mode field radius approximately doubling.

Figure 7A:
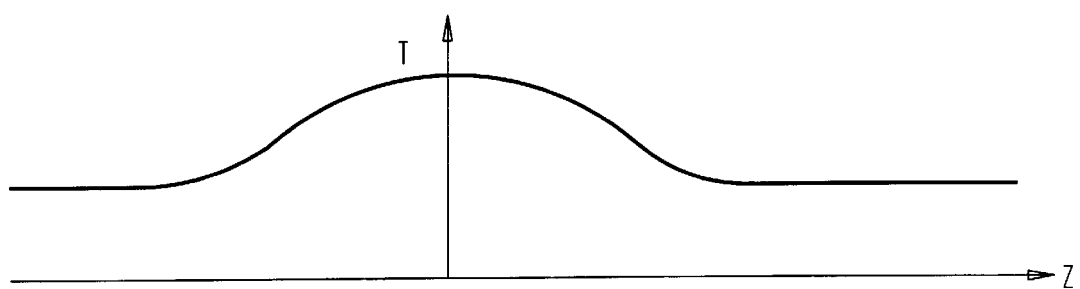
FIG. 7A graphically depicts a temperature profile for the temperature applied to a fiber-optic cable along its longitudinal axis (i.e., the z-axis) during the formation a tapered fiber-optic system in accordance with the present invention.
Figure 7B:
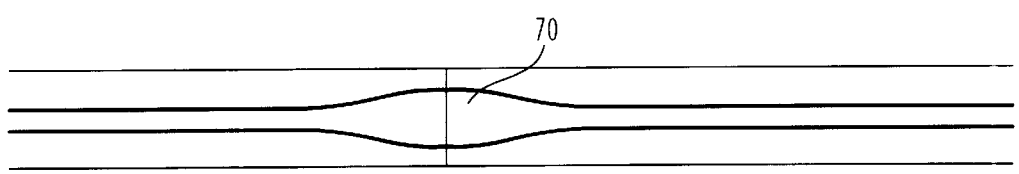
FIG. 7B is a partial cross-sectional view of a fiber-optic cable having a tapered core section.
Figure 7C:
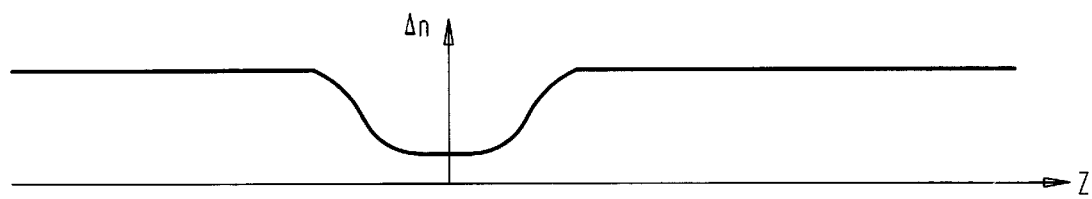
FIG. 7C graphically depicts the effective refractive index along the longitudinal axis (i.e., z-axis) of a fiber-optic cable formed in accordance with the present invention.

One method of producing a tapered fiber-optic system 60 in accordance with the present invention involves exposing a part of a conventional single-mode fiber to a high temperature ambient through micro-burner or micro-heater heating process, where the peak temperature to which the part of the fiber-optic cable is exposed exceeds the melting temperature of glass. This is graphically depicted in FIG. 7A, which shows a longitudinal temperature profile along the fiber axis, Z. Exposure of the part of the fiber-optic cable to the high temperature causes a tapered core section 70 to form as depicted in FIG. 7B. That exposure also causes a change of Δn (see, e.g., FIG. 7C) due to the diffusion of Germanium in the fiber core during the non-uniform heating process. Once the tapered core section 70 is formed, the fiber-optic cable 64 may be cleaved approximately at the middle of that section 70 to yield two fiber-optic cables, each having a tapered core 62 and each suitable for constructing a tapered fiber-optic system 60 in accordance with the present inventions.

Figure 6:
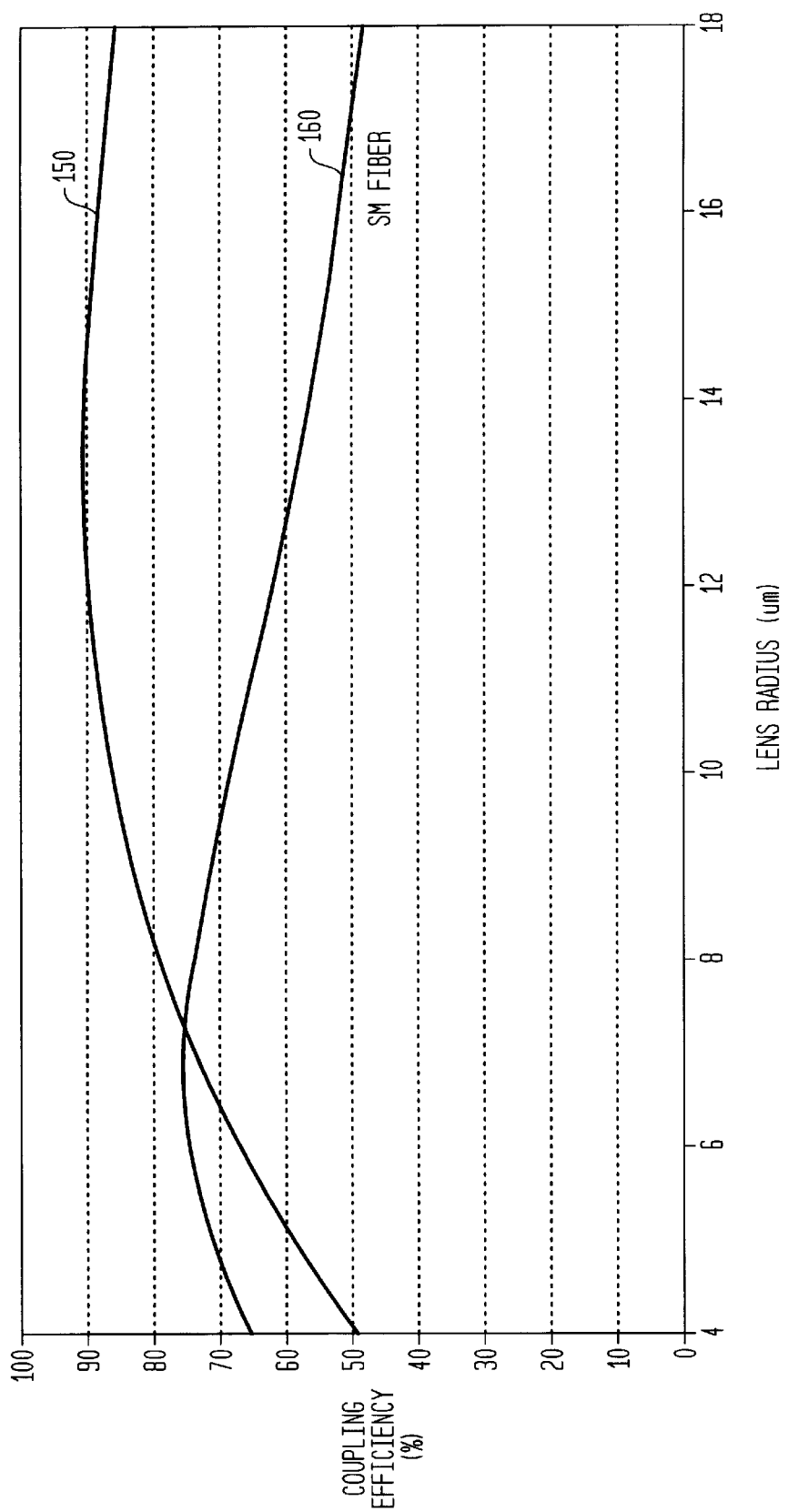
FIG. 6 graphically depicts the coupling efficiency versus fiber lens radius for a conventional single-mode fiber and a tapered fiber core of a tapered fiber-optic system constructed in accordance with the present invention.

To determine a radius for the cylindrical lens 66 to maximize the coupling efficiency between the LASM laser 10 and fiber-optic cable 64, reference may be had to FIG. 6 in which the coupling efficiency for a conventional single-mode fiber-optic cable, depicted as reference numeral 160, is compared with the coupling efficiency for a tapered fiber-optic system 60 constructed in accordance with an embodiment of the present invention, depicted as reference numeral 150. The coupling efficiency was calculated based on Fresnel diffraction theorem, thin lens approximation, and overlap integral. A maximum coupling efficiency of approximately 75% for the conventional single-mode fiber may be obtained for a lens radius of approximately 6 $\mu$m and with a distance of approximately 10 $\mu$m between the front facet 12 of the laser 10 and the lens of the fiber-optic cable. A maximum coupling efficiency of approximately 90.3% may be obtained with a tapered fiber-optic system 60 constructed in accordance with the present invention and having a lens radius approximately equal to 14 $\mu$m. This represents 20% increase in the coupling efficiency. The distance between the laser facet 12 and the lens 66 is approximately 26 $\mu$m and the tolerance on the lens radius is much more relaxed with the present invention than with conventional fiber-optic cables, because the larger distance implies less sensitivity.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A large area single mode (LASM) laser system comprising:
    a laser having a gain region of predetermined area defined by a generally horizontal gain width and generally vertical waveguide width and including a gain medium, and being operable in spontaneous emission mode and causing an optical signal to propagate in a propagation direction;
    a first lens located downstream from said laser in the propagation direction, said first lens being a unitary cylindrical lens, for focusing said optical signal in a generally vertical direction and in a direction opposite of the propagation direction;
    a second unitary lens located downstream from said first lens in the propagation direction and for collimating said optical signal in a generally horizontal direction and in a generally vertical direction in a direction opposite of the propagation direction; and
    a single-mode fiber-optic cable located downstream from said second unitary lens in the propagation direction and having a fiber grating for reflecting a single-mode of said optical signal in a direction opposite of the propagation direction, said reflected single-mode of said optical signal facilitating single-mode operation of said laser.

2. A large area single mode (LASM) laser system as recited by claim 1, wherein said fiber grating reflects a single-mode of said optical signal near a gain peak of said laser.

3. A large area single-mode (LASM) laser system as recited by claim 2, wherein said fiber grating provides a wavelength-selective reflection of said optical signal.

4. A large area single-mode (LASM) laser system as recited by claim 1, wherein said gain region has an area in a range of approximately 2 $\mu m^2$ to 16 $\mu m^2$.

5. A large area single-mode (LASM) laser system as recited by claim 4, wherein said gain region has a generally horizontal width in a range of approximately 2.5 $\mu$m to 20 $\mu$m.

6. A large area single-mode (LASM) laser system as recited by claim 4, wherein said gain region has a generally horizontal width approximately equal to 2.5 $\mu$m.

7. A large area single-mode (LASM) laser system as recited by claim 1, wherein said single-mode fiber-optic cable has a first refractive index and wherein said fiber grating has a second refractive index that is different from said first refractive index.

8. A large area single-mode (LASM) laser system as recited by claim 7, wherein said first refractive index is approximately equal to 0.0036.

9. A large area single-mode (LASM) laser system as recited by claim 7, wherein said second refractive index is approximately equal to 0.0009.

10. A large area single-mode (LASM) laser system as recited by claim 1, wherein said first lens is generally cylindrical.

11. A large area single-mode (LASM) laser system comprising:
    a laser having a gain region of predetermined area defined by a generally horizontal gain width and generally vertical waveguide width and including a gain medium, and being operable in spontaneous emission mode and causing an optical signal to propagate in a propagation direction; and
    a two-lens optical signal conditioner located downstream from said laser in the propagation direction for reflecting a single-mode of said optical signal in a direction opposite of the propagation direction and for facilitating single-mode operation of said laser, said optical signal conditioner comprising;
    a unitary cylindrical lens located downstream from said laser in the propagation direction for focusing said optical signal in a generally vertical direction and in a direction opposite of the propagation direction;
    a unitary focusing lens located downstream from said cylindrical lens in the propagation direction and for collimating said optical signal in a generally horizontal direction and in a generally vertical direction when said optical signal is caused to propagate in a direction opposite of the propagation direction; and
    a single-mode fiber-optic cable located downstream from said unitary focusing lens in the propagation direction and having a fiber grating for reflecting a single-mode of said optical signal in a direction opposite of the propagation direction, said reflected single-mode of said optical signal facilitating single-mode operation of said laser.

12. A large area single mode (LASM) laser system as recited by claim 11, wherein said fiber grating reflects a single-mode of said optical signal near a gain peak of said laser.

13. A large area single-mode (LASM) laser system as recited by claim 11, wherein said fiber grating provides a wavelength-selective reflection of said optical signal.

14. A large area single-mode (LASM) laser system as recited by claim 11, wherein said gain region has an area in a range of approximately 2 $\mu m^2$ to 16 $\mu m^2$.

15. A large area single-mode (LASM) laser system as recited by claim 14, wherein said gain region has a width in a range of approximately 2.5 $\mu m$ to 20 $\mu m$.

16. A large area single-mode (LASM) laser system as recited by claim 14, wherein said gain region has a width approximately equal to 2.5 $\mu m$.

17. A large area single-mode (LASM) laser system as recited by claim 11, wherein said single-mode fiber-optic cable has a first refractive index and wherein said fiber grating has a second refractive index that is different from said first refractive index.

18. A large area single-mode (LASM) laser system as recited by claim 17, wherein said first refractive index is approximately equal to 0.0036.

19. A large area single-mode (LASM) laser system as recited by claim wherein said second refractive index is approximately equal to 0.0009.

20. A large area single-mode (LASM) laser system comprising:

a laser having a gain region of predetermined area defined by a generally horizontal gain width and generally vertical waveguide width and including a gain medium, and being operable in spontaneous emission mode and causing an optical signal to propagate in a propagation direction; and an optical signal conditioner located downstream from said laser in the propagation direction for reflecting a single-mode of said optical signal in a direction opposite of the propagation direction and for facilitating single-mode operation of said laser;

wherein said optical signal conditioner comprises a tapered fiber-optic system located downstream from said laser in the propagation direction and having cylindrical lens at an optical input of said tapered fiber-optic system and a tapered fiber core optically coupled to a single mode fiber-optic cable including a fiber grating for reflecting a single-mode of said optical signal in a direction opposite of the propagation direction, said reflected single-mode of said optical signal facilitating single-mode operating of said laser.

21. A large area single mode (LASM) laser system as recited by claim 20, wherein said fiber grating reflects a single-mode of said optical signal near a gain peak of said laser.

22. A large area single-mode (LASM) laser system as recited by claim 20, wherein said fiber grating provides a wavelength-selective reflection of said optical signal.

23. A large area single-mode (LASM) laser system as recited by claim 20, wherein said single-mode fiber-optic cable has a first refractive index and wherein said fiber grating has a second refractive index that is different from said first refractive index.

24. A large area single-mode (LASM) laser system as recited by claim 20, wherein said first refractive index is approximately equal to 0.0036.

25. A large area single-mode (LASM) laser system as recited by claim wherein said second refractive index is approximately equal to 0.0009.

26. A large area single-mode (LASM) laser system comprising:

a laser having a gain region of predetermined area defined by a generally horizontal gain width and generally vertical waveguide width and including a gain medium, and being operable in spontaneous emission mode and causing an optical signal to propagate in a propagation direction; and a tapered fiber-optic system located downstream from said laser in the propagation direction and having cylindrical lens at an optical input of said tapered fiber-optic system and a tapered fiber core optically coupled to a single-mode fiber-optic cable including a fiber grating for reflecting a single-mode of said optical signal in a direction opposite of the propagation direction, said reflected single-mode of said optical signal facilitating single-mode operation of said laser.

27. A large area single mode (LASM) laser system as recited by claim 26, wherein said fiber grating reflects a single-mode of said optical signal near a gain peak of said laser.

28. A large area single-mode (LASM) laser system as recited by claim 26, wherein said fiber grating provides a wavelength-selective reflection of said optical signal.

29. A large area single-mode (LASM) laser system as recited by claim 26, wherein said gain region has an area in a range of approximately 2 $\mu m^2$ to 16 $\mu m^2$.

30. A large area single-mode (LASM) laser system as recited by claim 29, wherein said gain region has a width in a range of approximately 2.5 $\mu m$ to 20 $\mu m$.

31. A large area single-mode (LASM) laser system as recited by claim wherein said gain region has a width approximately equal to 2.5 $\mu m$.

* * * * *